United States Patent [19]

Koishi

[11] Patent Number: 4,811,302

[45] Date of Patent: Mar. 7, 1989

[54] DYNAMIC SEMICONDUCTOR MEMORY WITH IMPROVED SENSING SCHEME

[75] Inventor: Keiji Koishi, Tokyo, Japan

[73] Assignee: NEC Corporation, Tokyo, Japan

[21] Appl. No.: 65,756

[22] Filed: Jun. 24, 1987

[30] Foreign Application Priority Data

Jun. 24, 1986 [JP] Japan ................................. 61-148511

[51] Int. Cl.⁴ .......................... G11C 7/00; G11C 11/40
[52] U.S. Cl. ..................................... 365/222; 365/189; 365/207; 365/210
[58] Field of Search ............... 365/189, 203, 222, 207, 365/210

[56] References Cited

U.S. PATENT DOCUMENTS 4,207,618 6/1980 White, Jr. et al. .................. 365/222
4,739,500 4/1988 Miyamoto et al. ............. 365/222 X Primary Examiner—Stuart N. Hecker
Assistant Examiner—Alyssa H. Bowler
Attorney, Agent, or Firm—Sughrue, Mion, Zinn, Macpeak & Seas

[57] ABSTRACT

An improved dynamic memory device having a high-speed operation and an increased utilization ratio is disclosed. The memory comprises first and second pairs of digit lines and first and second sense amplifiers and is featured in that the first and second sense amplifiers are electrically connected in parallel and commonly used to amplify a signal difference between a selected one pair of the first and second digit lines with the other non-selected pair of digit lines electrically isolated from the both sense amplifiers in an access mode, and the first and second sense amplifiers are independently connected to the first digit lines and second digit lines, respectively in a refresh mode.

6 Claims, 3 Drawing Sheets

DYNAMIC SEMICONDUCTOR MEMORY WITH IMPROVED SENSING SCHEME

BACKGROUND OF THE INVENTION

The present invention relates to a dynamic semiconductor memory and, more particularly to a dynamic type random access memory employing MOS transistors.

Dynamic type random access memories (DRAMs) have been widely utilized as large capacity memories.

A DRAM is usually structured such that a plurality of memory cells are arranged in a matrix form of rows and columns. Word lines are arranged in rows while digit lines are arranged in columns. Also, sense amplifiers are provided for the respective digit lines for reading or refreshing the content of selected memory cells. A signal read-out from a memory cell via a digit line is applied to a sense amplifier which amplifies the read-out data. A memory cell employing one transistor and one capacitor is generally utilized in a DRAM.

In recent years, memory capacity has been enlarged and the number of memory cells has been greatly increased. This also means an increase in the number of word lines intersecting the digit lines and an increase in the number of memory cells connected to the respective digit lines. Accompanied by the increase in the memory cells connected to each digit line increases, the electrostatic capacitance of the digit line also is increased. Therefore, input signal level to a sense amplifier is often reduced, resulting in malfunction of the sense amplifier. For the purpose of compensating for such reduction in the input signal level to the sense amplifier, a so-called "shared amplifier" technique has been proposed. According to this technique, a pair of digit lines are physically split into two pairs of digit lines and a selected one of the pairs of digit lines is electrically connected to a sense amplifier. Thus, the capacitance of the split digit lines is greatly reduced to increase the read-out signal at the digit line. This shared sense amplifier technique is disclosed in U.S. Pat. No. 4,366,559 issued to Misaizu et al.

Information stored in the memory cells disappears over time, and hence the memory cells have to be subjected to a refresh operation at a contant time interval so as to hold the information. This refresh is achieved by cyclically selecting one word line and amplifying data stored the memory cells connected to the selected word line and repeating the above cycle for all the word lines. Therefore, for a large capacity memory and a large number of word lines, the number of the above cycles is large. This means that the total time period for refreshing all the memory cells is large and hence the utilization ratio of the memory is lowered.

SUMMARY OF THE INVENTION

It is one object of the present invention to provide a dynamic memory which can achieve refresh operation at a high speed.

It is another object of the present invention to provide a dynamic memory which can operate at a high speed.

A memory device according to the present invention comprises a first pair of digit lines, a second pair of digit lines, a plurality of memory cells coupled to the respective digit lines, a first sense amplifier having a pair of sense nodes, a second sense amplifier having a pair of sense nodes, a pair of first switches coupled between the pair of sense nodes of the first sense amplifier and the pair of sense nodes of the second sense amplifier, a pair of second switches coupled between the pair of first digit lines and the pair of sense nodes of the first sense amplifier, and a pair of third switches coupled between the pair of second digit lines and the sense nodes of the second sense amplifier. In an active operating mode which allows an access to a desired memory cell, the pair of first switches are rendered conductive so that the first and second sense amplifiers are electrically connected in parallel and the pair of second switches and the pair of third switches are conducted when the memory cell coupled to the first digit line is selected and when the memory cell coupled to the second digit line is selected, respectively. Therefore, the signal difference between the pair of digit lines to be read is amplified by both of the first and second sense amplifiers so that high speed operation can be achieved. While in a refresh mode in which a plurality of memory cells are automatically refreshed in sequence, the pair of first switches are rendered non-conductive and the pair of second switches and the pair third switches are rendered conductive so that the first and second sense amplifiers are electrically connected to the first digit lines and the second digit lines, respectively. Therefore, each of the first and second sense amplifiers amplifies signal difference in each pair of digit lines in parallel to achieve refresh levels on the first digit lines and the second digit lines in parallel. Thus, the number of memory cells to be refreshed during one refresh cycle can be doubled.

DETAILED DESCRIPTION OF THE INVENTION

Figure 1:
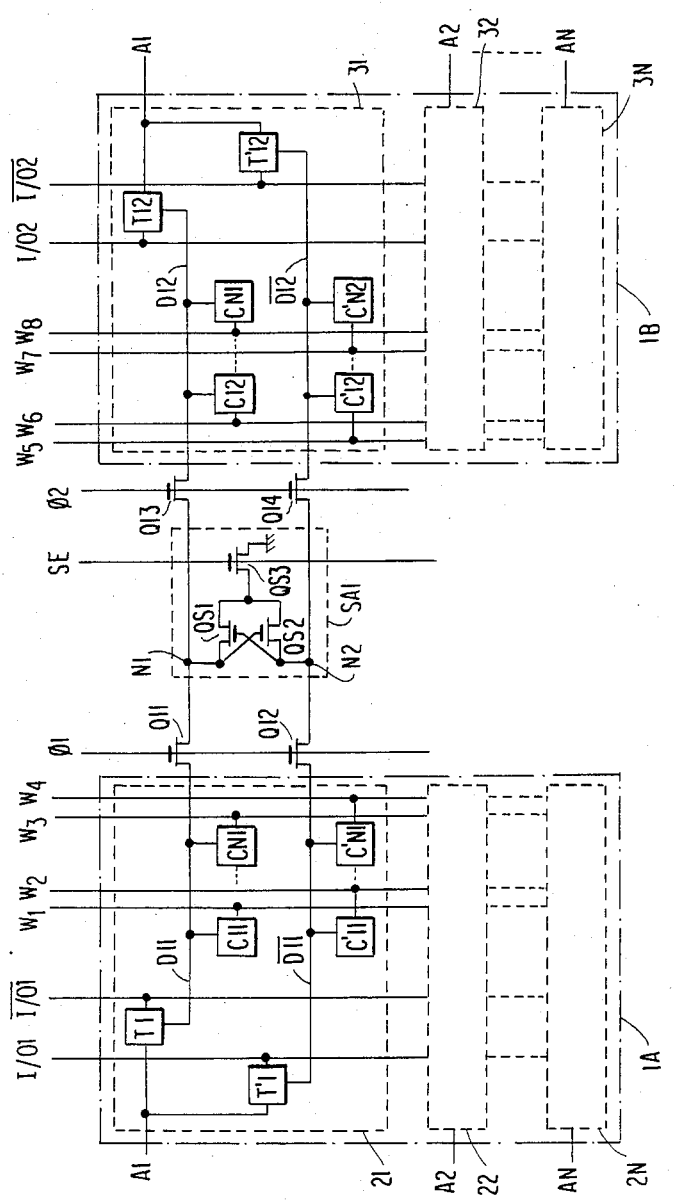
FIG. 1 is a schematic block diagram of a memory device according to the prior art.

Referring to FIG. 1, a conventional memory device employing the shared sense amplifier scheme is explained. A group of dynamic memory cells (C11 ... CN1, C'11 ... C'N1) is arranged at the intersections of word lines W1 to W4 and a pair of digit lines D11 and $\overline{D11}$ at a column area 21 in a memory array 1A. The array 1A also includes other column areas 22 to 2N having the same structure as that of the array 21. Similarly, another array 1B includes a plurality of column areas 31 to 3N. The column area 31 includes a group of memory cells ($C_{12}$-$C_{N2}$, $C'_{12}$-$C'_{N2}$) coupled to a pair of digit lines D12 and $\overline{D12}$ and word lines W5-W8. The pair of digit lines D11 and $\overline{D11}$ are coupled to a pair of bus lines I/O1 and $\overline{I/O1}$ via a pair of column selection gates T1 and T'1 which are controlled by a column selection signal A1. Similarly, the pair of digit lines D12 and $\overline{D12}$ are coupled to a pair of bus lines via a pair of column selection gates T12 and T'12 controlled by the column selection signal A1.

Figure 2:
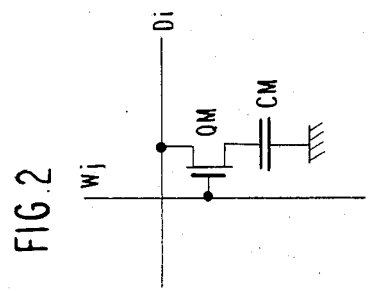
FIG. 2 is a schematic circuit diagram of a memory cell.

A circuit structure of the memory cells is shown in FIG. 2. The memory cell is composed of a storage capacitor CM and a memory cell transistor QM coupled between one of the digit line Di and the capacitor CM and having a gate connected to one word line Wj.

Figure 3:
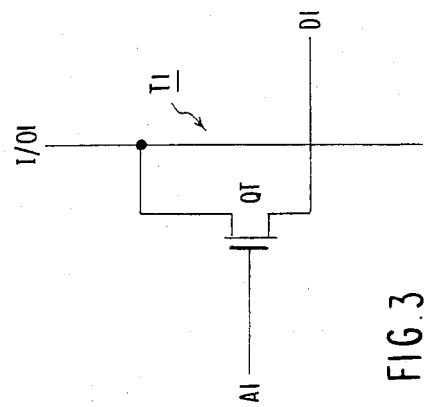
FIG. 3 is a schematic circuit diagram of a column selection gate.

An example of the column selection gate such as T1 is shown in FIG. 3. A transfer gate MOS transistor QT is coupled between the digit line D1 and the bus line I/O1 and has a gate supplied with the column selection signal A1.

Returning to FIG. 1, a differential type sense amplifier SA1 is composed of a pair of cross-coupled MOS transistors QS1 and QS2 having gates and drains cross-connected at a pair of sense nodes N1 and N2 and an enable MOS transistor QS3. The pair of digit lines D11 and $\overline{D11}$ are connected to the pair of sense nodes N1 and N2 of the sense amplifier SA1 via a pair of transfer gate MOS transistors Q11 and Q12, while the pair of digit lines D12 and $\overline{D12}$ are connected to the nodes N1 and N2 via a pair of transfer gate MOS transistors Q13 and Q14, respectively. Although not shown in FIG. 1, one sense amplifier is provided for each pair of the column areas 22 and 32, . . . 2N and 3N, respectively.

Among word lines W1 to W8, only one word line is selected. If the word line such as W1 crossing the array 1A is selected, a control signal $\phi_1$ is selected with a control signal $\phi_2$ non-selected. Thus, the sense amplifier SA1 is connected to the pair of digit lines D11 and $\overline{D11}$ via the conducting transistors Q11 and Q12. In this instance the digit lines D12 and $\overline{D12}$ are electrically isolated from the sense amplifier SA1. Then, in response to the rise of a sense control signal SE, the sense amplifier SA1 starts to amplify the level difference between the digit lines D11 and $\overline{D11}$. In this memory device, when the memory array 1A is selected, the memory array 1B is left in a non-operating state and no refresh operation is achieved therein. In other words, in order to refresh all the memory cells in both arrays 1A and 1B, all the word lines have to be energized one by one and the number of refresh cycles is as large as the number of the word lines of the both arrays 1A and 1B.

Figure 4:
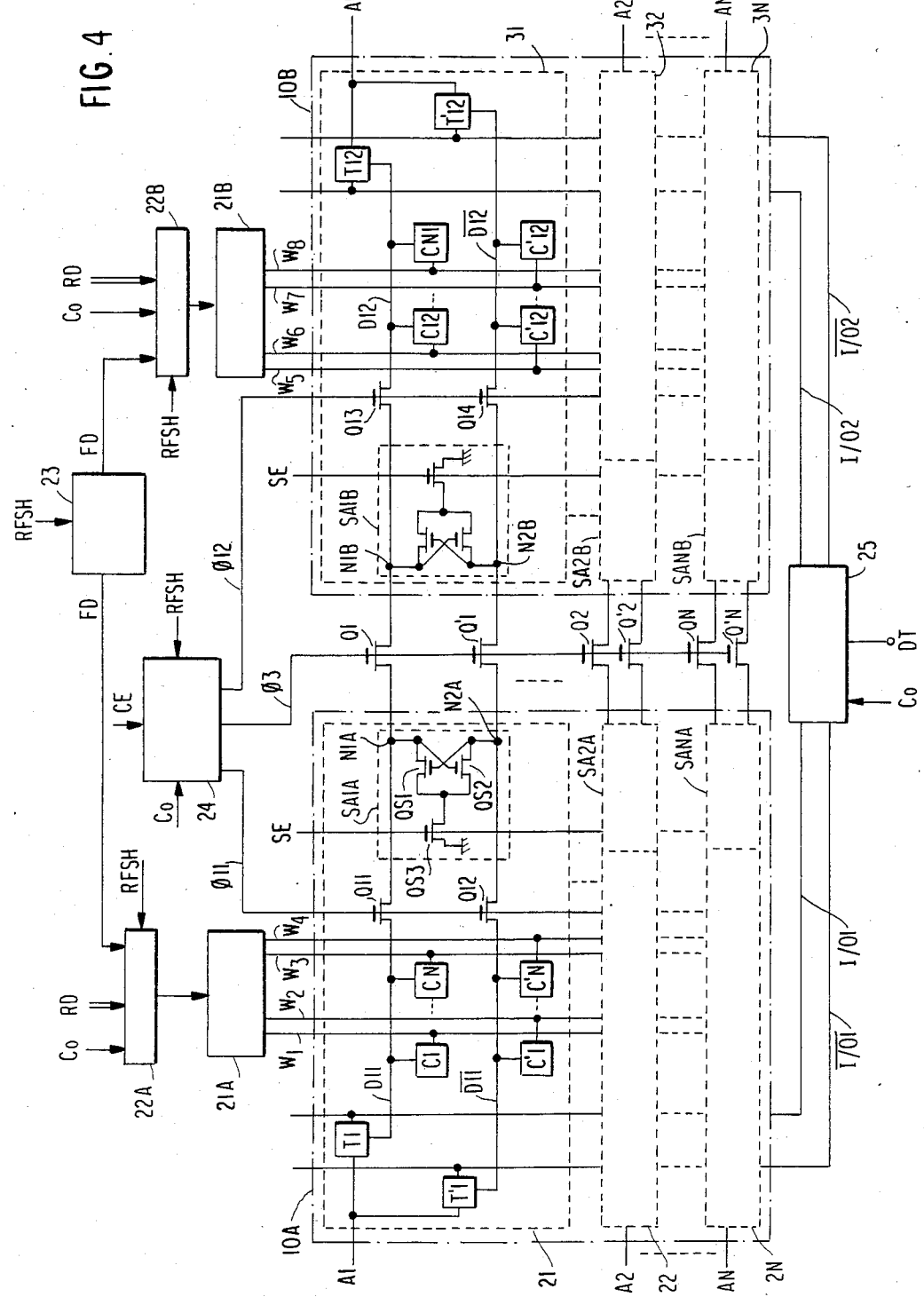
FIG. 4 is a schematic block diagram of a memory device according to one embodiment of the present invention.

Referring to FIG. 4, a memory device according to one embodiment of the present invention is explained.

A plurality of memory cells are arranged in two memory arrays 10A and 10B having substantially the same scheme. Similar to the device of FIG. 1, a plurality of pairs of digit lines such as D11 and D11, and D12 and D12 are arranged at column areas 21 to 2N, and 31 to 3N in the arrays 10A and 10B, respectively.

According to the present invention, a plurality of sense amplifiers SA1A to SANA are provided for the respective column areas 21 to 2N in the array while sense amplifiers SA1B to SBNB are provided for the respective column areas 31 to 3N of the array 1B, as illustrated. In the following, explanation is given with respect to the column areas 21 and 31 by way of explanation.

A pair of sense nodes N1A and N2A of the sense amplifier SA1A are coupled to the pair of digit lines D11 and $\overline{D11}$ via a pair of transfer gate MOS transistors Q11 and Q12. A pair of sense nodes N1B and N2B of the sense amplifier SA1B are coupled to the pair of digit lines D12 and $\overline{D12}$ via a pair of transfer gate transistors Q13 and Q14, respectively. In addition, the pair of sense nodes N1A and N2A of the sense amplifier SA1A are connected to the pair of sense nodes N1B and N2B of the sense amplifier SA1B via a pair of transfer gate transistors Q1 and Q'1, respectively. A pair of bus lines I/O1 and $\overline{I/O1}$ extending from the array 10A and a pair of bus lines I/O2 and $\overline{I/O2}$ extending from the array 10B are inputted to a selection circuit 25 which selects one pair of the bus lines for data input or data output via a data terminal in accordance with a least significant bit of column address data which is not used to generate column selection signals A1 to AN, thus achieving a column selection as a whole with the column selection signals A1 to AN. In the case where one of word lines of the array 10A is selected, the selection circuit 25 establishes an information path between the pair of bus lines I/O1 and $\overline{I/O1}$ and the terminal DT. A control circuit 24 receives the column address signal Co, a chip select signal CE and a refresh control signal RFSH and generates a control signal $\phi_{11}$ applied to gates of the transistors Q11 and Q12, a control signal $\phi_{12}$ applied to gates of the transistors Q13 and Q14, and a control signal $\phi_3$ applied to gates of the transistors Q1 and Q'1. Here, it is assumed that a "0" level of Co designates the array 10A and a "1" level of Co designates the array 10B. When CE is at an active (e.g. high or "1") level and RFSH is at an inactive (e.g. low or "0") level, the memory is set in active operating mode for allowing access to a selected memory cell, the signal $\phi_3$ is energized to render the transistors Q1 and Q'1 conductive and one of $\phi_{11}$ and $\phi_{12}$ is energized with another non-energized in accordance with the contents of Co. When Co is at logic "0" level and the array 10A is selected, the signal $\phi_{11}$ is energized to render the transistors Q11 and Q12 conductive while $\phi_{12}$ is not energized to maintain the transistors Q13 and Q14 non-conductive. Thus, both of the sense amplifiers SA1A and SA1B are connected to the pair of digit lines D11 and $\overline{D11}$ in parallel. Similarly, when Co is at a logic "1" level and the array 10B is selected, the transistors Q13 and Q14 are rendered conductive in response to a high level of $\phi_{12}$ while the transistors Q11 and Q12 are kept non-conductive in response to a low level of $\phi_{11}$ so that both of the sense amplifiers SA1A and SA1B are connected to the digit lines D12 and $\overline{D12}$ in the array 10B. Word lines W1-W4 of the array 10A are selected by a row decoder 21A and word lines W5-W8 of the array 10B are selected by a row decoder 21B. A multiplexer 22A receives row address signals RD, the least significant column address signal Co and refresh address data FD which is generated by a refresh address counter 23 in a refresh mode in response to the inactive level of RFSH and transmits the RD and Co to the row decoder 21A in the active mode (the inactive level of RFSH) and the refresh address data thereto in the refresh mode in response to the active level of RFSH. Similarly, a multiplexer 22B transmits to the row decoder 21B the RD and Co in the active mode and the FD in the refresh mode.

In the active mode, one of the word lines of the array 10A is selected by the decoder 21A in the case of "0" level of Co and one of the word lines of the array 10B is selected by the decoder 21B in the case of "1" level of Co.

Thus, in the active mode, each pair of digit lines in the selected array are subjected to amplification by two sense amplifiers, and therefore high speed amplification and fast read-out can be achieved.

While in the refresh mode, the signal $\phi_3$ is rendered inactive and the signals $\phi_{11}$ and $\phi_{12}$ are rendered active so that the sense amplifiers SA1A and SA1B are electrically isolated from each other and the sense amplifiers SA1A and SA1B are electrically connected to the pair of digit lines D11 and $\overline{D11}$, and the pair of digit lines D12 and $\overline{\text{D12}}$, respectively. While the multiplexers 22A and 22B transmit the refresh address data generated from the refresh address counter 23 to the decoders 21A and 21B in response to the active level of RFSH, each of the decoders 21A and 21B operating in parallel selects one word line in accordance with the contents of FD in parallel so that memory cells coupled to two word lines in the arrays 10A and 10B are simultaneously refreshed by enabling the sense amplifiers SA1A and SA1B in response to an active level of SE. In this embodiment, the data length in bits of FD is selected the same as that of RD so that both of the decoders 21A and 21B simultaneously select one of the word lines in the array 10A and one of the word lines in the array 10B, respectively.

Thus, the number of memory cells to be refreshed at one refresh cycle is twice that of the conventional memory of FIG. 1, and therefore, the number of refresh cycles required to refresh all the memory cells in the device can be greatly reduced.

Figure 5:
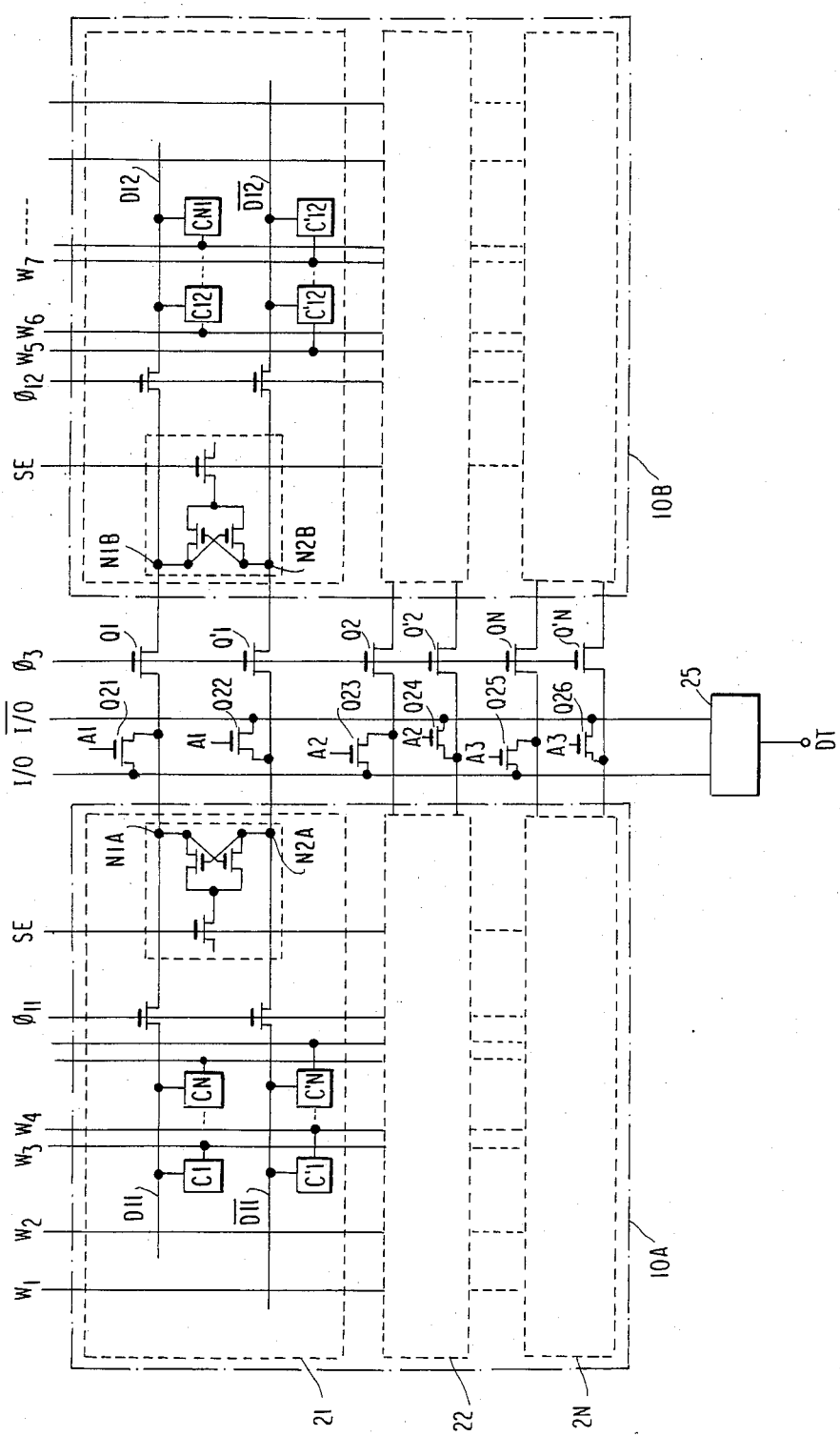
FIG. 5 is a schematic block diagram of a memory device according to another embodiment of the present invention.

Referring to FIG. 5, a memory device according to another embodiment is explained.

This embodiment is obtained by replacing the two pairs of bus lines I/O1, $\overline{\text{I/O1}}$, I/O2, and $\overline{\text{I/O2}}$ with a common pair of bus lines I/O and $\overline{\text{I/O}}$. The pair of the sense nodes N1A and N2A are coupled to I/O and $\overline{\text{I/O}}$ via a pair of column selection transistors Q21 and Q22 controlled by the column selection signal A1. An input-/output circuit 25' is provided for I/O and $\overline{\text{I/O}}$ for data output or input via the data terminal DT.

I claim:

1. A dynamic memory device comprising a pair of first digit lines, a pair of second digit lines, a plurality of dynamic type memory cells coupled to said first and second digit lines, a first sense amplifier having a pair of sense nodes, a second sense amplifier having a pair of sense nodes, a pair of first switches coupled between the pair of sense nodes of said first sense amplifier and the pair of sense nodes of said second sense amplifier, a pair of second switches coupled between said pair of first digit lines and the pair of sense nodes of said first sense amplifier, a pair of third switches coupled between said pair of second digit lines and the pair of the sense nodes of said second sense amplifier, a first control circuit for rendering said pair of first switches conductive in an active mode for allowing access to a selected memory cell and non-conductive in a refresh mode, respectively, and a second control circuit for rendering one of said pair of second switches and said pair of third switches conductive in accordance with address information in said active mode and for rendering both of said pair of second switches and said pair of third switches conductive in said refresh mode.

2. The memory device according to claim 1, in which each of said memory cells includes a storage capacitor and a transfer transistor coupled between said storage capacitor and one of said digit lines.

3. The memory device according to claim 1, in which each of said sense amplifiers includes a pair of transistors having gates and drains cross-connected at the sense nodes and commonly connected sources.

4. The memory device according to claim 1, in which said pair of first digit lines are arranged in a first array region and said pair of second digit lines are arranged in a second array region apart from said first array region.

5. The memory device according to claim 1, in which the memory cells coupled to said pair of first digit lines are connected to a plurality of first word lines and the memory cells coupled to said pair of second digit lines are coupled to a plurality of second word lines, one of said first and second word lines being selected in said active mode and one of said first word lines and one of said second word lines being selected simultaneously in said refresh mode.

6. A dynamic memory device comprising a pair of first digit lines, a plurality of first word lines, a plurality of first memory cells coupled to said first digit lines and said first word lines, a pair of second digit lines, a plurality of second word lines, a plurality of second memory cells coupled to said second digit lines and said second word lines, a first sense amplifier having a pair of sense nodes, a second sense amplifier having a pair of sense nodes, first connection means for operatively connecting the sense nodes of said first sense amplifier and the sense nodes of said second sense amplifier in parallel, second connection means for operatively connecting said pair of first digit lines and the pair of sense nodes of said first sense amplifier, third connection means for operatively connecting said pair of second digit lines and the pair of sense nodes of said second sense amplifier, word selection means coupled to said first and second word lines for selecting one of said first and second word lines in an access mode and selecting the respective ones of said first and second word lines in a refresh mode, first control means for enabling said first switches in said access mode and disenabling said first switches in said refresh mode, respectively, and second control means for enabling either pair of said second and third switches in said access mode and enabling both said second and third switches in said refresh mode.

* * * * *

UNITED STATES PATENT AND TRADEMARK OFFICE
CERTIFICATE OF CORRECTION

PATENT NO. : 4,811,302

DATED : March 7, 1989

INVENTOR(S) : KEIJI KOISHI

It is certified that error appears in the above-identified patent and that said Letters Patent is hereby corrected as shown below:

Col. 1, lines 28 and 29, delete "Accompanied by the increase in the memory cells" and insert --As the number of memory cells--.

line 45, delete "contant" and insert --constant--.

Col. 3, line 47, delete "D11", first occurrence and insert -- $\overline{D11}$ --.

line 48, delete "D12" and insert --$\overline{D12}$--.

Signed and Sealed this

Twelfth Day of December, 1989

Attest:

JEFFREY M. SAMUELS

*Attesting Officer*     *Acting Commissioner of Patents and Trademarks*